US007002374B2

(12) United States Patent
Anderson et al.

(10) Patent No.: US 7,002,374 B2
(45) Date of Patent: Feb. 21, 2006

(54) DOMINO LOGIC COMPATIBLE SCANNABLE FLIP-FLOP

(75) Inventors: Scott B. Anderson, Del Mar, CA (US); Razak Hossain, San Diego, CA (US); Thomas D. Zounes, Carlsbad, CA (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 10/248,719

(22) Filed: Feb. 12, 2003

(65) Prior Publication Data

US 2004/0155678 A1 Aug. 12, 2004

(51) Int. Cl.
*H03K 19/096* (2006.01)

(52) U.S. Cl. .......................................... 326/95; 326/93

(58) Field of Classification Search .................. 326/93, 326/95–98; 327/199–202
See application file for complete search history.

(56) References Cited

U.S. PATENT DOCUMENTS 5,041,742 A * 8/1991 Carbonaro .................... 326/97
5,694,362 A * 12/1997 Zhang et al. .......... 365/189.07
5,883,529 A * 3/1999 Kumata et al. ............... 326/93
6,686,776 B1 * 2/2004 Sakata et al. ................. 326/95

* cited by examiner

*Primary Examiner*—James H. Cho
(74) *Attorney, Agent, or Firm*—Lisa K. Jorgenson; William A. Munck

(57) ABSTRACT

A testable, prechargeable circuit has a driving circuit for producing a driving circuit output signal. A timing circuit receives a clock signal and the driving circuit output signal to cause an output of the testable, prechargeable circuit to be in a low state when the clock signal is low. The timing circuit also causes the output of the circuit to be timed with a state change in the clock signal to provide a domino logic output signal. Either a data signal or a test signal are multiplexed to the input of the driving circuit to produce respectively the domino logic output signal or a test output signal. A static logic circuit receives the test output signal to produce a test signal output.

20 Claims, 3 Drawing Sheets

DOMINO LOGIC COMPATIBLE SCANNABLE FLIP-FLOP

BACKGROUND OF INVENTION

1. Field of Invention

This invention relates to improvements in logic circuits and techniques, and more particularly to improvements in logic circuits and techniques that are compatible with domino logic circuit structures, and still more particularly to improvements in logic circuits and techniques of the type described that are scannable for circuit testing.

2. Background of Invention

Recently, domino logic circuits and design have been receiving the attention of logic circuit designers and fabricators. Domino logic is a precharged, non-inverting family of Complementary Metal Oxide Silicon (CMOS) logic that uses multiple clock phases to effect high-speed operation. Domino logic is faster than standard static logic, but it is more difficult to design because of its increased complexity, primarily in the clocking network.

Typically in domino logic, at least a "precharge" clock phase is used, followed by an "evaluate" clock phase. During the precharge phase, when the clock is low, the output of the cell goes low. During the evaluate phase, when the clock is high, the output of the cell can either transition from a low to a high value or remain at a low value. This is in contrast to standard static logic typically used with CMOS technology. In static logic designs, the output of the cell can arbitrarily rise or fall depending on the input conditioning during normal operation.

Flip-Flops are fundamental building blocks for flow control and pipelining in digital CMOS integrated circuit designs, and have been widely used in domino logic. It has been proposed in some domino logic circuits to use only a pulsed domino latch structures for interfacing with domino logic or standard flip-flops.

In addition, it has been proposed to use full-keeper circuits to prevent the output of the pulsed domino latch from floating when no path to ground or to the supply voltage rail is present. The full-keeper circuit will prevent charge loss due to noise. The keeper circuit prevents the pulsed domino latch from floating when the circuit is not directly driven. Keeper circuits may include, for instance, back-to-back or two cross-coupled inverters. The cross-coupling feedback introduces hysteresis when the pulsed domino latch is directly driven through its inputs. The hysteresis increases the delay through the circuit and the short circuit current power consumed by the circuit.

In addition, in the past, conditional shutoff circuits in the pulse generator have been proposed. The conditional shutoff circuit may be a NAND-logic gate that enables the output of the pulsed domino latch to continue discharging after the sampling window. However, this is not necessary if the duration of the sampling window is long enough.

To interface to static logic, it has been proposed to use an N-$C^2$MOS stage followed by a full-keeper structure as a latching element. However, an output glitch occurs if both the output and data input are at logical high values when the clock signal rises.

Moreover, in the past, scan testing has not been employed in conjunction with the input and output flip-flops or latches, for various reasons. Among the reasons that would argue against the inclusion of scan testing counterintuitive is the notion that to include such scan testing capabilities might undesirably slow down the input or output flip-flop or latch circuits.

What is needed, therefore, is a sequential logic circuit that can interface with a domino circuit and supports scan testing with minimal overhead in terms of performance loss, power consumption, and enlargement of the area footprint.

SUMMARY OF INVENTION

The invention discloses several new circuits based on scannable flip-flop designs that may be used for driving domino logic circuits. In order to interface with a domino circuit, a sequential timing element is provided that assures that the output is low when the clock signal is low but allows the output to follow the circuit output when the clock transitions.

One design based on the L1–L2 flip-flop is disclosed for driving domino circuits. Also, a variant of the pulse latch design is disclosed. The new structure has an improved keeper structure in the master pulse latch that is faster than that shown in the known prior art. A slave-latch design is also disclosed that has glitch free outputs.

According to a broad aspect of the invention, a circuit is presented for driving a domino logic circuit. The circuit includes a clock signal having first and second states, and a driving circuit for producing a driving circuit output signal. A sequential timing circuit receives the driving circuit output signal and the clock signal to cause an output of the circuit to be in a low state when the clock signal is in the first state. The sequential timing circuit causes the output of the circuit to be timed with a state change in the clock signal from the first to the second states to represent the output of the circuit.

According to another broad aspect of the invention, a logic circuit is presented that includes a domino logic circuit having a logic signal input and a logic signal output. A circuit is provided for timing the logic signal output with a clock transition, and a circuit is provided for selectively applying a data signal and a test signal to the logic signal input to produce respectively a domino logic output signal and a test output signal. A static logic circuit receives the logic signal output to produce a test signal output suitable for a scan chain.

According to yet another broad aspect of the invention, a latch circuit is presented that includes a master latch circuit clocked by a clock signal. A slave latch circuit is also provided that is clocked by the clock signal. A timing element causes an output of the master latch to be in a low state when the clock signal is in a low state and to be the master latch output when the clock signal transitions to a high state.

BRIEF DESCRIPTION OF DRAWINGS

The invention is illustrated in the accompanying drawing, in which.

DETAILED DESCRIPTION

Disclosed, according to a preferred embodiment of the invention, is the design of a scannable flip-flop that can be used with domino logic. The architecture of such a flip-flop based on static and domino flip-flops is given.

Figure 1:
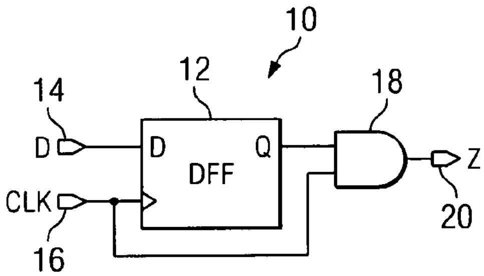
FIG. 1 is a schematic diagram of a D-type flip-flip circuit used in a domino logic circuit, according to the prior art, that can be used as a performance goal in the design of a master-slave flip-flop.

An arbitrary prior art flip-flop circuit 10 that can be arranged to drive domino logic circuitry (not shown) is shown in FIG. 1, to which reference is now made. The flip-flop circuit 10 includes a D-type flip-flip 12, having a data input, D, 14 and clock, Clk, input to receive a clock signal on terminal 16. The Q output of the D-type flip-flip 12 is compared to the clock signal, Clk, on input terminal 16 by an AND gate 18 to produce a Z output on terminal 20 when they are both high. Thus, the flip-flop circuit 10 assures that the domino output, Z, is low when the clock, Clk, is low, and the output is monotonically stable. The flip-flop circuit 10 of FIG. 1 can be used as the performance model against which the scan testable circuits according to the invention can be compared.

Figure 2:
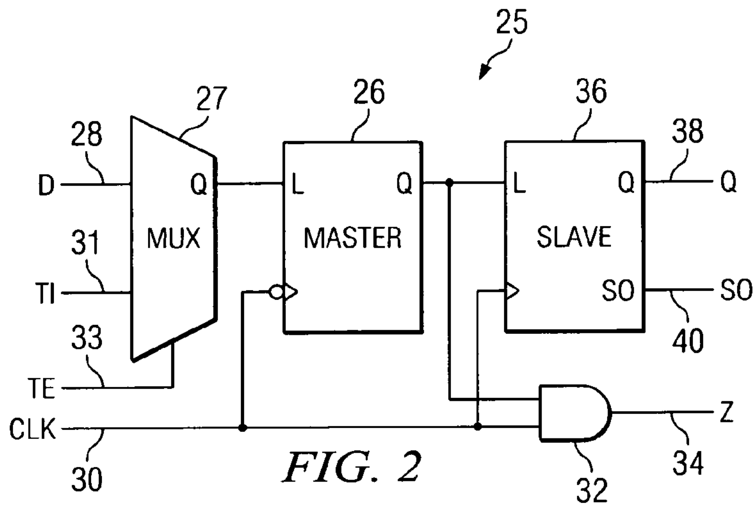
FIG. 2 is a schematic diagram of a master-slave flip-flop, wherein a slave stage provides a static scan output that is decoupled from the domino output of the master and the static output of the slave, according to a preferred embodiment of the invention. Thus, the scan output can be tied low during the normal mode of operation to reduce power and signal integrity noise.

FIG. 2, to which reference is now additionally made, shows a latch circuit 25 modification to the flip-flop circuit 10 of FIG. 1, in which a scan testing capability has been added, according to a preferred embodiment of the invention. The circuit 25 is a master-slave latch circuit, in which the outputs of the slave latch stage 36 provide static outputs, Q and SO, to hold a scan test result, decoupled from the domino output, Z. The domino output, Z, is in fact provided at the output of a level sensitive latch and not an edge sensitive flip-flop. Due to the clocking mechanism employed in domino cells, it is often possible to replace a flip-flop with a latch. By using a latch instead of a full flip-flop for the domino output results in a circuit that is by comparison faster and can consume less power since the slave stage can be completely disabled when not in scan mode of operation if the static output Q does not drive any logic.

More particularly, the circuit 25 includes a master latch 26, which receives on its L input data from a multiplexer 27, and receives on its clock input a clock signal, Clk, from a clock input line 30. In a manner similar to that described above with respect to the flip-flop circuit 10 of FIG. 1, the Q output of the master latch 26 is compared to the clock signal, Clk, by an AND gate 32 to provide a domino output, Z, from AND gate 32 on output line 34. The AND gate causes the output of the latch to be in a low state when the clock signal is in a low state. Otherwise, the output from the circuit is the same as that held in the latch, and is timed by the rising edge of the clock signal, Clk.

In addition, the Q output of the master latch 26 is connected to an L input of the slave latch 36. The slave latch 36 is clocked by the same clock signal as the master latch 26 by the clock signal, Clk, on line 30. The outputs from the slave latch 36 are developed on output terminals Q and SO, to provide, respectively, on lines 38 and 40, static data, and scan data outputs.

As mentioned, the input to the master latch 26 is derived from the multiplexer 27, which has a normal data input to receive the data signal, D, on line 28 as well as a test data input, TI, that receives a test data signal, on line 31, for example from a testing device or from another flip-flop or latch under test (not shown). The selection between the data signal, D, and test data input, TI, is controlled by a test enable signal, TE, on line 33 applied to the multiplexer 27. Test data and enable signals and procedures are generally known in the art, generally in the context of setting and resetting static scan flip-flops to apply test signals to associated complex circuitry, and are not described in detail herein.

Because the outputs from the slave latch 36 are decoupled from the domino logic output, Z, the scan test result may be available, even though the master latch is in a precharge mode. Finally, in the circuit 25 of FIG. 2, decoupling signals and logic enables loading to be reduced. It is also possible to selectively turn off the decoupled signals and logic with simple circuit modifications (not shown) in order to save power and reduce signal integrity noise.

Figure 3:
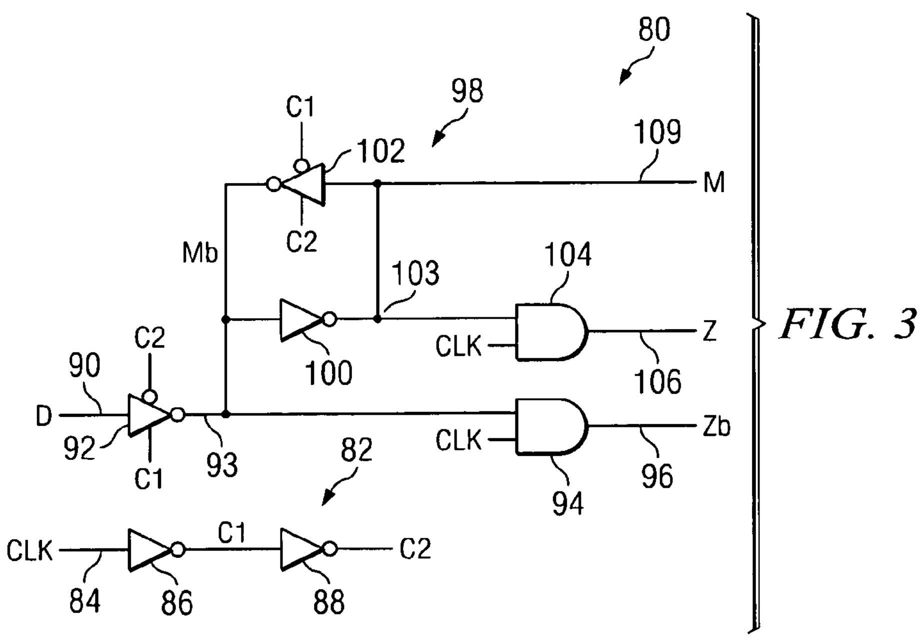
FIG. 3 is a schematic diagram showing a latch circuit having dual-rail domino data output signals and an interface to a slave latch, according to a preferred embodiment of the invention. It is a detailed variant of FIG. 2 without the test multiplexer and slave latch circuitry explicitly shown.

FIG. 3 is an electrical schematic diagram of a latch circuit embodiment 80 having both domino and static test outputs, according to a preferred embodiment of the invention. The circuit 80 has domino outputs, denoted Z and Zb, where Zb is the logical signal inverse of Z; however, both Z and Zb go low when the clock signal goes low. The circuit 80 can be used to implement the master latch 26 and the AND gate 32 in circuit 25 shown in FIG. 2.

The circuit 80 is clocked by clock signals C1 and C2 provided by clock generator 82. The clock generator 82 receives original clock signals, Clk, on input line 84 to inverter 86, to generate clock signal C1, which is applied to an inverter 88, which generates clock signal C2. Clock signals C1 and C2 are, therefore, out of phase by 180 degrees.

The circuit 80 has a data input, D, on line 90 to an tristate inverter 92 that is clocked by both clock signals C1 and C2 to generate an output on line 93. The signal on line 93 is compared with the original clock signal, Clk, by AND gate 94 to provide an inverted output domino signal, Zb, on line 96.

A latch circuit 98 includes a forward inverter 100 and reverse tristate inverter 102, the reverse tristate inverter 102 being clocked by clock signals C1 and C2, in opposite manner than the inverter 92, to increase the speed of the latch by alleviating the hysteresis. The output of the latch 98 is generated on node 103, which is compared with the original clock, Clk, by AND gate 104 to provide the uninverted domino output, Z, on line 106.

Figure 4:
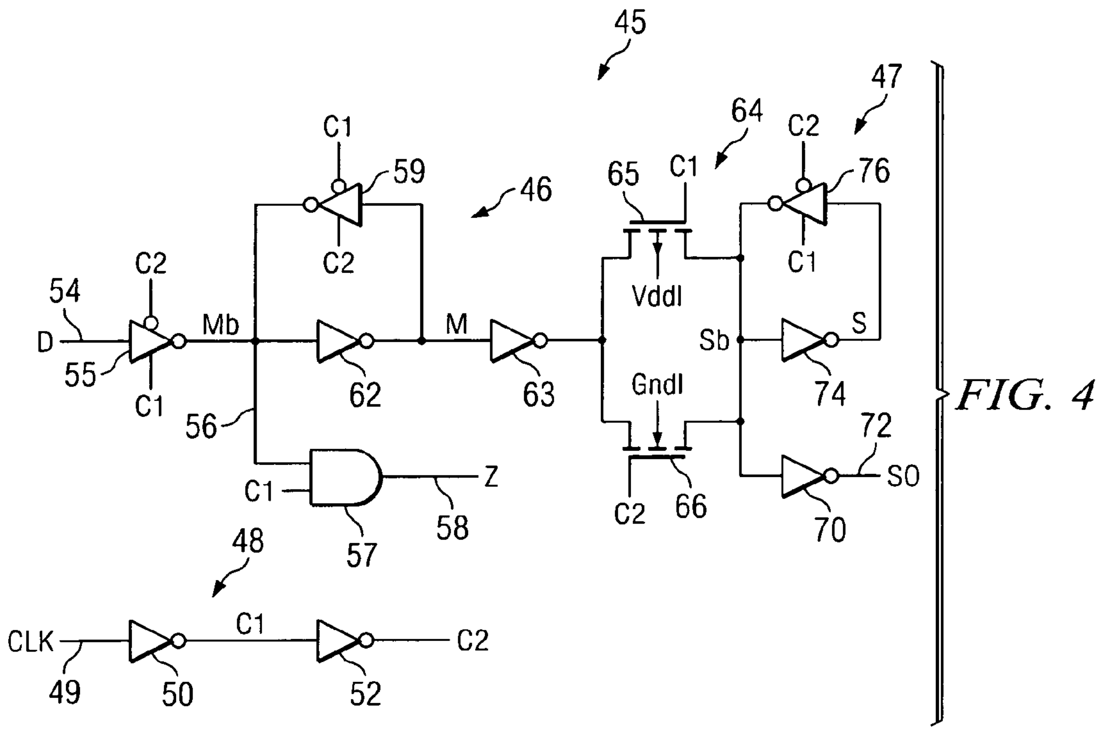
FIG. 4 depicts a circuit having domino outputs and static decoupled test outputs, according to a preferred embodiment of the invention. It is a more detailed depiction of FIG. 2 without the test multiplexer circuitry explicitly shown.

An additional domino latch circuit embodiment 45 is shown in FIG. 4, to which reference is now additionally made. The circuit 45 represents an implementation of master latch 26, the slave latch 36 and the AND gate 32 in circuit 25 shown in FIG. 2. The circuit 45 includes a local clock generator 48, which receives an original clock signal input, Clk, on line 49. The local clock generator 48 serves to generate out of phase clock signals C1 and C2 at the respective outputs of inverters 50 and 52.

Data, D, is received on input line 54, and is clocked into the circuit by tristate inverter 55, which is clocked by both clock signals C1 and C2. The data output from inverter 55 on line 56 is then compared by AND gate 57 to the original clock signal, Clk, to provide a domino output on line 58.

Keeper circuits 46 and 47 are utilized as the latching mechanisms within the circuit 45, and are used to statically hold test data when the circuit is operated in a test mode of operation. The reverse tristate inverters 59 and 76 of the respective master and slave keeper circuits 46 and 47 are each clocked by appropriate local clock signals, C1 and C2, to speed up their operation. Logic can be incorporated into the master latch 46 and the slave latch 47, if desired. Incorporating logic is commonly used, for instance, for control signals such as multiplexing data signals, data enable, data hold, clear data, and set data.

The master keeper circuit 46 includes a forward inverter 62, the output of which is held or latched by tristate inverter 59, which is clocked in opposite manner from that of inverter 55. The test signal will be multiplexed (not shown) with the data signal on line 54 as implied by 27.

The output from the master keeper 46, denoted M, is provided to the input of inverter 63. The output from the inverter 63 is applied to a transmission gate 64, which includes PMOS device 65 and NMOS device 66, clocked by respective clock signals C1 and C2. The transmission gate 64 effectively decouples the slave keeper 47 from the master keeper 46.

The output of the transmission gate 64 is connected to the slave keeper, 47, which includes a forward inverter 74 and a second, clocked reverse inverter 76. The input of inverter 74 is also connected to an output inverter 70, which provides the test output, SO, which is held on line 72.

Thus, in operation, the circuit 45 may be used in either normal domino mode or in test mode. In test mode, the test data is latched on the test output line 72, and decoupled from the master latch by the transmission gate 64.

Figure 5:
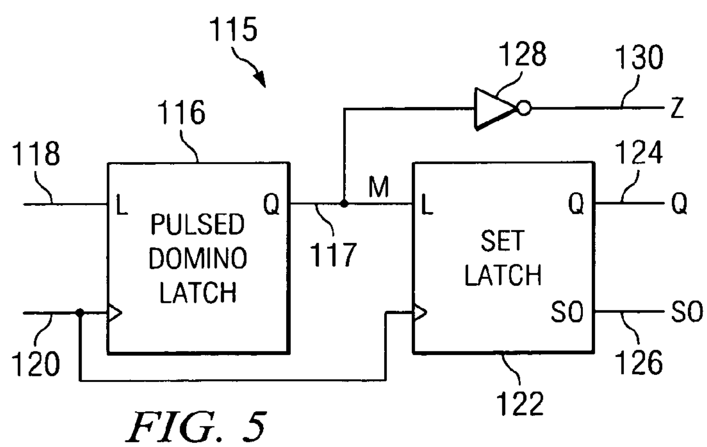
FIG. 5 is a schematic diagram of a logic circuit based on a domino pulsed latch, according to a preferred embodiment of the invention.

Another architecture based upon the principles of the invention is a design based on a domino pulsed latch 115, having a testability capability, as shown in FIG. 5, to which reference is now additionally made. The domino pulsed latch 115 includes a pulsed domino latch circuit 116 having a data input 118 and a clock input 120. The domino output is obtained at the Q output of the latch on line 117, and is inverted by inverter 128 to provide the domino output, Z, of the circuit on line 130.

To provide a static test data output, a set latch 122 is provided. The set latch 122 is connected to receive the output of the master domino latch 116 as well as the clock signal on line 120. The SO output from the set latch 122 provides the static test output on line 126. A Q static data output may also be provided on line 124, as shown.

The pulsed domino latch 116 essentially includes a dynamic gate with a self-timed pulse generator. The pulse is generated on a rising edge of the clock. The sampling period for the data signal is determined by the relative timing mismatch that occurs between the clock and a delayed version of the clock. The output of the pulsed domino latch is pseudo-static due to a keeper. A full-keeper circuit, which includes a tristate inverter similar to 102 in FIG. 3, may be used. If such a clocked keeper circuit is used in the design, then the timing mismatch introduced by delaying the clock must be accounted for (not shown). A half-keeper pull-up structure may be used in nanometer CMOS processes in lieu of a full-keeper since leakage currents will keep the dynamic node low.

Figure 6:
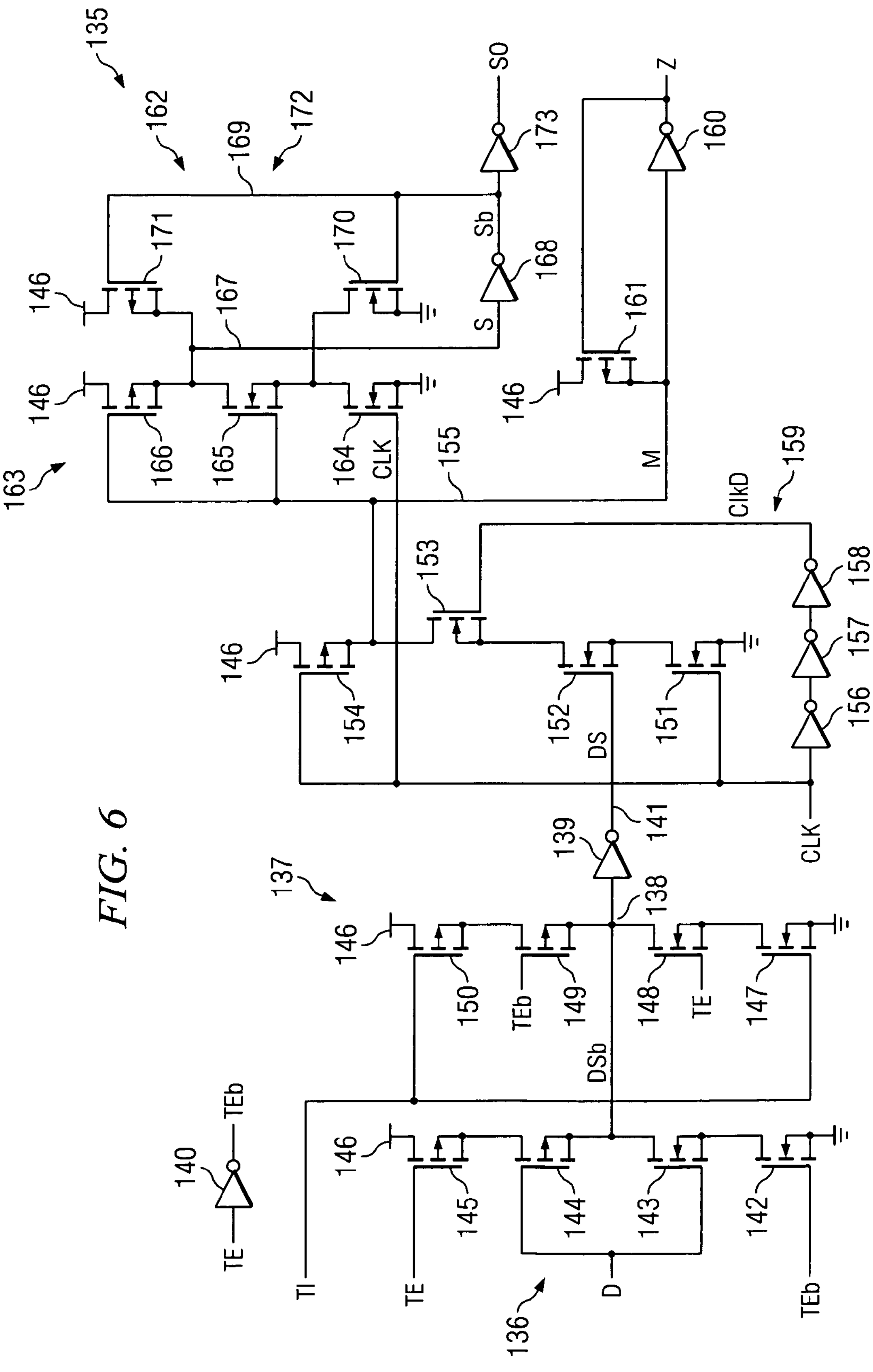
FIG. 6 is a schematic diagram of a circuit having a domino pulsed latch and a set dominant latch, according to a preferred embodiment of the invention that may be used to interface with static logic.

A detailed electrical schematic diagram of a scan testable domino pulsed latch 135, is shown in FIG. 6. The circuit includes two tristate inverters 136 and 137 that drive node DSb on line 138. It also includes two regular inverters 139 and 140 to form a multiplexer circuit. The inverter 139 from node DSb, which drives node DS on line 141, causes the multiplexer to be a non-inverting circuit. Node DS drives the pulsed latch through the gate of NMOS transistor 152. The multiplexer circuit has a data input (D), a test input for scan (TI), and a test enable input (TE), for toggling between scan mode and the normal mode of operation. An inverter 140 is used to generate the inverse of the test enable signal, denoted TEb. The test enable signal or its inverse may be used to deactivate scan circuitry to save power and to force the scan output (SO) to remain low during the normal mode of operation (not shown).

The first tristate inverter 136 has the data input (D) connected to the gates of PMOS and NMOS transistors 144 and 143, respectively. These transistors share the same drain connection to node DSb on line 138. The test enable input (TE) connects to the gate of PMOS transistor 145, which has its source connected to the Vcc power supply rail 146 and its drain connected to PMOS transistor 144. The inverse of test enable (TEb) connects to the gate of NMOS transistor 142, which has its source connected to ground and its drain connected to NMOS transistor 143.

The second tristate inverter 137 has the test input (TI) connected to the gates of PMOS and NMOS transistors 150 and 147, respectively. The source of PMOS transistor 150 is connected to Vcc 146 and the drain is connected to the source of PMOS transistor 149. The source of NMOS transistor 147 is connected to ground and the drain is connected to the source of NMOS transistor 148. The inverse of test enable (TEb) is connected to the gate of PMOS transistor 149. Test enable (TE) is connected to the gate of NMOS transistor 148. Transistors 148 and 149 share the same drain connection to node DSb on line 138. Since the test enable, TE, and the inverse test enable, TEb, signals are connected to the two tristate inverters, neither the data input nor the test input will conduct at the same time due to the polarity of the test enable signal.

In the sampled pulse latch, an NMOS transistor 151, with its gate connected to the clock signal (Clk), connects the source of the NMOS transistor 152 to ground. Similarly, NMOS transistor 153, having its gate connected to a delayed inverted clock signal, ClkD, and a PMOS transistor 154, having its gate connected to the clock signal, Clk, connects the drain of the transistor 153 to a Vcc rail 146. The PMOS transistor 154 precharges the dynamic node M on line 155 in order to refresh the circuit for conditional evaluation. The delayed clock signal, ClkD, may be, for example, delayed by an odd number of inverters, such as inverters 156–158, as shown. The drain of NMOS transistor 151 connects to the source of NMOS transistor 152. The source of NMOS transistor 153 connects to the drain of NMOS transistor 152. As stated previously the gate of NMOS transistor 152 is driven by the output of inverter 141 and is denoted as node DS on line 141.

The domino output is derived from the output of the pulse latch 159, denoted as M on line 155, and may be provided as the domino circuit output, Z, via inverter 160.

The keeper circuit in 135 includes a PMOS transistor 161 to which the domino output Z is applied to the gate. The source of PMOS transistor 161 is connected to the Vcc rail 146 and the drain is connected to node M on line 155. The keeper draws charge from its source to charge the dynamic node M, when the output Z is low.

The output from the pulsed domino latch, M on line 155, is also connected to a set dominant latch circuit 162. The set dominant latch circuit is used, for example, to interface with static logic in a pulsed-latch flip-flop design. A static logic interface is necessary for the proper operation of automatic test pattern generators, which require that the precharge condition not be propagated to subsequent logic circuitry.

As shown, the input M on line 155 is connected first to an inverter 163 in the set dominant slave latch, which includes a PMOS transistor 166 connected to the Vcc rail 146, and an NMOS transistor 165 that is connected to ground through a second NMOS transistor 164. The second NMOS transistor 164 receives a clock signal, Clk, which is zero in precharge mode to prevent the data circuit from overwriting the data held in the data gate.

The output from the inverter 163 is connected on line 167, called the slave node S, to a forward keeper inverter 168. The forward slave keeper inverter 168 drives the inverted slave node Sb on line 169. A feedback inverter 172 is formed by a PMOS transistor 171 connected to the Vcc rail 146, and an NMOS transistor 170 that is connected to a second NMOS transistor 165. The NMOS transistor 170 has its source connected to ground. The second NMOS transistor 165 and the PMOS transistor 171 share a drain connection to the slave node S on line 167 to compete the slave latch feedback loop. The second NMOS transistor 165 effectively connects the drains of PMOS transistor 171 and NMOS transistor 170 together when the master node M on line 155, which drives the gate of transistor 165, is logically high. The master node M is logically high when the master is in the "precharge" state. As stated previously, the "precharge" state occurs when the clock signal, Clk, is low, since this causes PMOS transistor 154 to conduct. This sequence of operations ensures that the slave latch is opaque when the circuit is in "precharge".

The scan output signal, SO, is driven by an inverter 173 from the Sb node on line 169. The inverter 173 may be replaced with a 2-input NOR logic gate with the second input connected to the inverse test enable signal, TEb, to disable the scan output signal (not shown).

The complement of the domino output Z can easily be derived from 135 by removing inverter 139 and reconnecting the scan output driver 173 input to the slave node S on line 167 instead of its inverse Sb on line 169 (not shown). The scan output driver input is changed such that the test input for scan goes through an even number of logical inversions to eventually become the scan output signal. Furthermore, a dual-rail output circuit can be summarily derived from the drawn circuit 135 and its complement with minimal logic duplication (not shown).

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

What is claimed is:

1. A circuit comprising:

a driving circuit for producing a driving circuit output signal;

an input circuit for selectively applying a data signal and a test signal to an input of the driving circuit; and a sequential timing circuit operable to receive said driving circuit output signal and a clock signal having first and second states, to cause an output of said sequential timing circuit to be in a low state when said clock signal is in said first state, and to cause the output of the sequential timing circuit to be timed with a state change in said clock signal from said first state to said second state and to represent said driving circuit output signal.

2. The circuit of claim 1, wherein said first clock state is a low state, and said second clock state is a high state.

3. The circuit of claim 1, wherein said sequential timing circuit comprises an AND gate.

4. The circuit of claim 1, wherein said driving circuit comprises at least one of: a flip-flop and a latch.

5. The circuit of claim 1, wherein the driving circuit is capable of producing the driving circuit output signal using the clock signal.

6. The circuit of claim 1, wherein the input circuit comprises a multiplexer capable of receiving the data signal and the test signal and providing one of the data signal and the test signal to the input of the driving circuit based on a test enable signal; and further comprising a static logic circuit capable of receiving the driving circuit output signal and outputting a scan test result.

7. The circuit of claim 1, wherein the driving circuit comprises one or more elements that are precharged during a time after a first clock transition and are evaluated during a time after a second clock transition.

8. A logic circuit, comprising:

a domino logic circuit having a logic signal input and a logic signal output;

a circuit for timing said logic signal output with a clock transition;

a circuit to selectively apply a data signal and a test signal to said logic signal input to produce respectively a domino logic output signal and a test output signal; and a static logic circuit to receive said logic signal output to produce a test signal output.

9. The circuit of claim 8, wherein said domino logic circuit comprises one or more elements that are precharged during a time after a first clock transition and are evaluated during a time after a second clock transition.

10. The circuit of claim 8, wherein said circuit for timing comprises an AND gate.

11. The circuit of claim 8, wherein said domino logic circuit comprises at least one of: a flip-flop and a latch.

12. The circuit of claim 8, wherein said domino logic circuit is a master flip-flop and said static logic circuit is a slave flip-flop.

13. The circuit of claim 8, wherein said domino logic circuit is a master latch and said static logic circuit is a slave latch.

14. The circuit of claim 8, wherein said circuit for timing said logic signal output with a clock transition is a sequential timing circuit.

15. The circuit of claim 14, wherein said sequential timing circuit comprises an AND gate.

16. The circuit of claim 8, further comprising a set data circuit connected to said domino logic circuit to set said logic signal output to a known state.

17. A latch circuit, comprising:

a master latch circuit clocked by a clock signal;

a slave latch circuit also clocked by said clock signal; and a timing element that operates to cause an output of said master latch to be in a low state when said clock signal is in a low state and to cause said output of said master latch to be a master latch output when said clock signal transitions to a high state.

18. The latch circuit of claim 17, wherein at least said master latch circuit comprises one or more elements that are precharged during a time after a first clock transition and are evaluated during a time after a second clock transition.

19. The latch circuit of claim 17, wherein both said master latch circuit and said slave latch circuit comprise elements that are precharged during a time after a first clock transition and are evaluated during a time after a second clock transition.

20. The latch circuit of claim 17, wherein said timing element comprises an AND gate having inputs to receive an output of said master latch and said clock signal.

* * * * *